(12) United States Patent
Liu

(10) Patent No.: US 7,489,187 B2
(45) Date of Patent: Feb. 10, 2009

(54) OPERATIONAL AMPLIFIER AND RELATED NOISE SEPARATION METHOD THEREOF

(75) Inventor: Chang-Shun Liu, Taipei (TW)

(73) Assignee: Realtek Semiconductor Corp., HsinChu (TW)

( * ) Notice: Subject to any disclaimer, the term of this patent is extended or adjusted under 35 U.S.C. 154(b) by 94 days.

(21) Appl. No.: 11/557,498

(22) Filed: Nov. 8, 2006

(65) Prior Publication Data
US 2007/0115049 A1 May 24, 2007

(30) Foreign Application Priority Data
Nov. 9, 2005 (TW) .............................. 94139267 A

(51) Int. Cl.
*H03F 1/02* (2006.01)
(52) U.S. Cl. .......................................... 330/9; 330/311
(58) Field of Classification Search .................. 330/9, 330/69, 51, 150, 252, 253, 310, 311
See application file for complete search history.

(56) References Cited

U.S. PATENT DOCUMENTS

| | | | |
|---|---|---|---|
| 4,172,238 A * | 10/1979 | Kusakabe | .................. 330/259 |
| 4,939,516 A | 7/1990 | Early | |
| 5,148,167 A | 9/1992 | Ribner | |
| 5,477,481 A | 12/1995 | Kerth | |
| 5,838,197 A * | 11/1998 | Tsukuda | .................... 330/252 |
| 6,404,367 B1 | 6/2002 | Van der Zwan | |
| 6,670,859 B2 * | 12/2003 | Sanduleanu | ................... 331/57 |
| 6,693,489 B2 * | 2/2004 | Cherry et al. | ............... 330/252 |
| 6,914,479 B1 * | 7/2005 | Gabillard et al. | ............. 330/69 |
| 6,946,890 B1 | 9/2005 | Lei | |

OTHER PUBLICATIONS

Design of Analog CMOS Integrated Circuit, p. 215-p. 217, McGraw Hill.
YuQing Yang, et al. "A 114-dB 68-mW Chopper Stabilized Stereo Multibit Audio ADC in 5.62 mm2," IEEE Journal of Solid-State Circuits, vol. 38, No. 12, Dec. 2003.

* cited by examiner

*Primary Examiner*—Henry K Choe
(74) *Attorney, Agent, or Firm*—Winston Hsu

(57) ABSTRACT

An amplifier includes: an input stage for receiving an input signal to generate a first signal corresponding to a first band; a first modulator coupled to the input stage for modulating the first signal to generate a second signal corresponding to a second band; an amplifier stage coupled to the first modulator for processing the second signal to generate a third signal, wherein the third signal includes a fourth signal corresponding to the second band and a first interference signal corresponding to the first band; and a second modulator coupled to the amplifier stage for modulating the third signal to generate a fifth signal corresponding to the first band and to generate a second interference signal corresponding to the second band.

17 Claims, 4 Drawing Sheets

OPERATIONAL AMPLIFIER AND RELATED NOISE SEPARATION METHOD THEREOF

BACKGROUND OF THE INVENTION

1. Field of the Invention

The present invention relates to electric circuit, and more particularly to an amplifier with noise separation.

2. Description of the Prior Art

In applications involving analog-to-digital converter (ADC), the processing of noise signal is a concern. For example, in an ADC or a digital-to-analog converter (DAC), increasing the signal-to-noise ratio (SNR) is regarded as an design consideration. One of the factors influencing the SNR is the transistor flicker noise. Flicker noise is an unwanted energy level that is generated when many dangling bonds appear at the interface between an oxide layer and the silicon substrate in the gate terminal of the transistor. When a charge carrier moves on the interface, some carriers are randomly captured and then released on the energy level to allow the drain terminal current to generate flicker noise. Therefore, reducing the flicker noise in an operational amplifier is a design concern.

The conventional methods for reducing flicker noise are described in the following:

(1) Enlarging the Area of the Transistor:

The relationship is provided below in the following formula (Razavi, B, "Design of Analog CMOS Integrated Circuits", pp. 215, McGraw Hill):

$$\overline{V_n^2} = \frac{K}{C_{OX}WL}\frac{1}{f}.$$

From the above-described formula, it can be induced from the inverse proportion of the WL that the component area must increase as (f) noise signal decreases. Moreover, an accompanying stray capacitance acts to increase the chip power load. Generally, 1/f noise from a PMOS transistor is less than that of a NMOS transistor.

(2) The Utilization of an Auto-Zero Mechanism:

In one of the prior methods, an operational amplifier stores its own low frequency noise signals when not processing an input signal. The operational amplifier then waits until the next time segment to subtract the flicker noise from the input signal. The disadvantage of this method is that an additional capacitor is required for storing the low frequency noise signal, thereby increasing the chip area.

(3) The Utilization of a Chopper:

With reference to FIG. 1 and FIG. 2. FIG. 1 is a circuit diagram illustrating a chopper applied to an integrated circuit 100 in a Sigma-delta Modulator according to a conventional method. FIG. 2 is a timing diagram of the integrated circuit 100 shown in FIG. 1. About more detailed description, please refer to Yang et al. "A 114-dB, 68-mW Chopper-stabilized Sreeo Multi-bit Audio ADC in 5.62 mm$^2$", JSSC, vol. 38, no. 12, December 2003 and U.S. Pat. No. 4,939,516.

A chopper is therefore applied to modulate the flicker noise of the operational amplifier 110 from a low band to a high band. Such a circuit comprises eight additional switch components (forming the modulators 120 and 130), and comprises clock signals to control the switch components. Additionally, the chopper switch is applied during the middle of the duty cycle of the control signal Phi1. After the chopper switch has been finished, the recovery time at the output end of the operational amplifier 110 is half of the duty cycle of the control signal Phi1.

SUMMARY OF THE INVENTION

One of the objectives of an embodiment of the present invention is to therefore provide an amplifier with a built-in modulator and a related noise separation method.

According to an embodiment of the present invention, an amplifier is disclosed. The amplifier comprises: an input stage for receiving an input signal to generate a first signal corresponding to the first band; a first modulator, coupled to the input stage, for modulating the first signal to generate a second signal corresponding to a second band; and an amplifier stage, coupled to the first modulator, for processing the second signal to generate a third signal, wherein the third signal comprises a fourth signal corresponding to the second band and a first interference signal corresponding to the first band.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
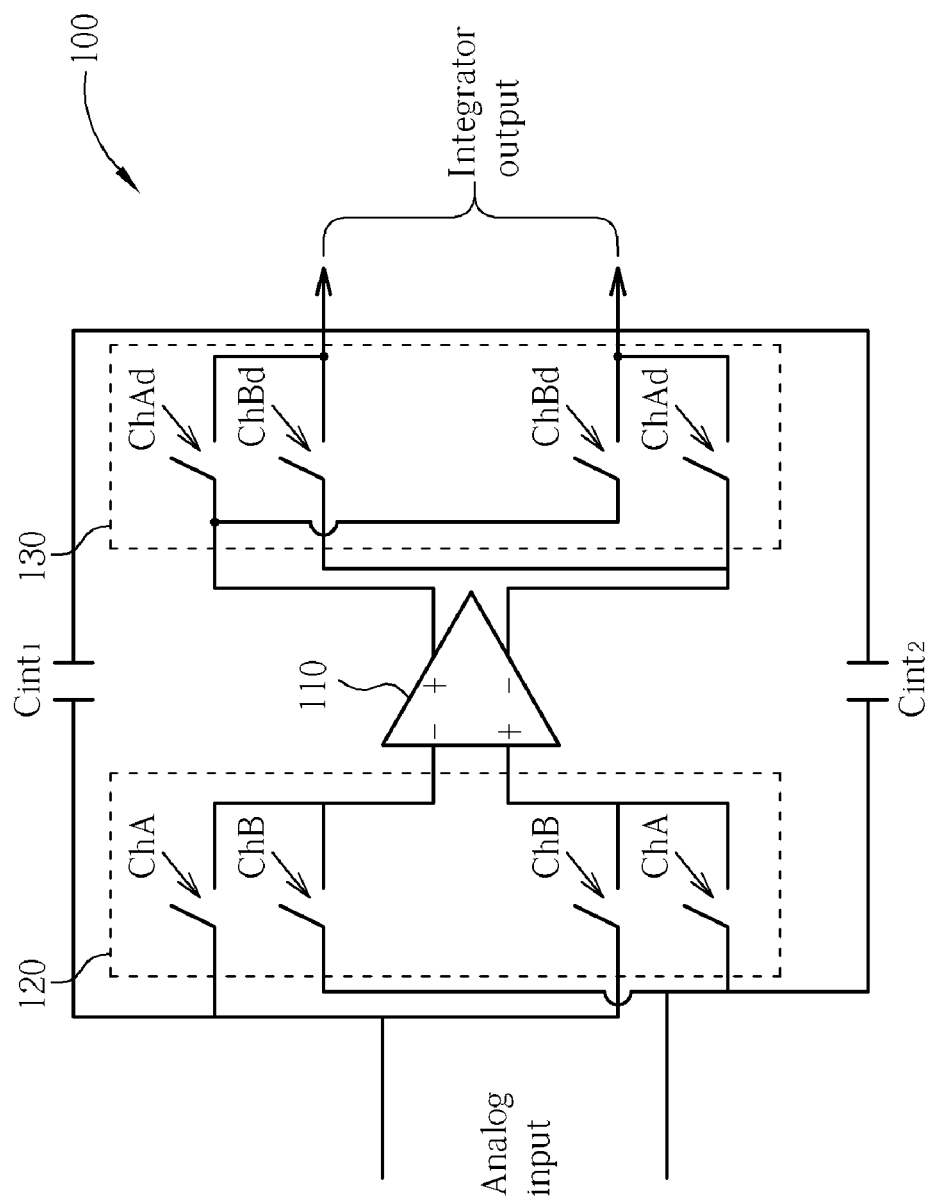
FIG. 1 is a circuit diagram describing that a chopper applied to an integrated circuit in a Sigma-delta Modulator according to a related art.
Figure 2:
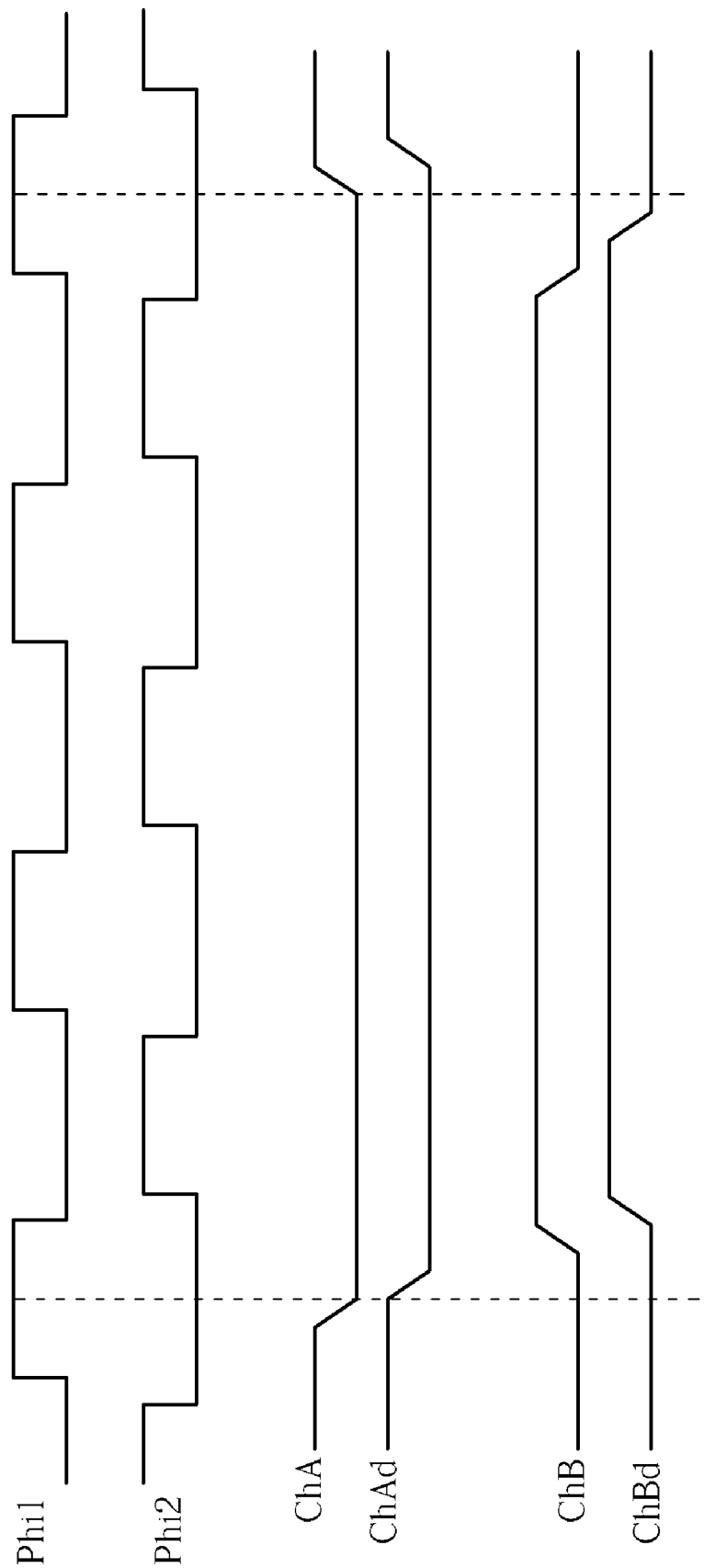
FIG. 2 is an operational timing diagram of the integrated circuit shown in FIG. 1.
Figure 3:
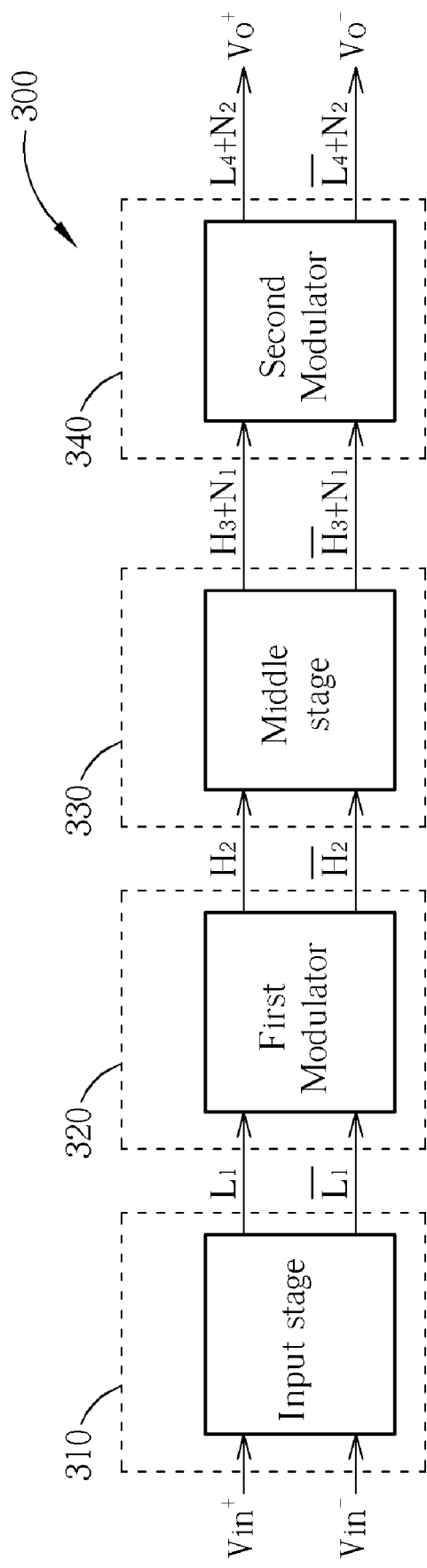
FIG. 3 is a functional block diagram of an operational amplifier according to the present invention.

FIG. 3 is a diagram of an amplifier 300 according to the present invention. The amplifier 300 includes an input stage 310, a first modulator 320, a middle stage 330 and a second modulator 340. The input stage 310 of the amplifier 300 comprises differential input ends receiving the differential input signals Vin+ and Vin− and amplifies the inputs signals Vin+ and Vin− to generate first differential signals $L_1$ and $\overline{L_1}$ of a first band. The first modulator 320 modulates the first differential signals $L_1$ and $\overline{L_1}$ to generate the second differential signals $H_2$ and $\overline{H_2}$ of a second band. The middle stage 330 performs a signal process on the second differential signals $H_2$ and $\overline{H_2}$ to generate the third differential signals $H_3$ and $\overline{H_3}$ corresponding to the second band. The middle stage 330, could be view as a load stage or a second amplifying stage in the amplifier 300, generates a noise signal and a first interference signal $N_1$. Hence, input signals received by the second modulator 340 can be considered input signals $H_3+N_{1-1}$ and $\overline{H_3}+N_{1-2}$. Please note that the first interference signal $N_1$ corresponds to the first band. Afterwards, the second modulator 340 modulates the input signals $H_3+N_{1-1}$ and $\overline{H_3}+N_{1-2}$ to generate input signals $L_4+N_2$ and $\overline{L_4}+N_2$. The second modulator 340 also transforms the third differential signals $H_3$ and $\overline{H_3}$ corresponding to the second band into the fourth differential signals $L_4$ and $\overline{L_4}$ corresponding to the first band. On the other hand, the second modulator 340 transforms the first interference signal $N_1$ corresponding to the first band into the second interference signal $N_2$ corresponding to the second band. In other words, the differential output ends Vo+ and Vo– of the amplifier 300 concludes by outputting the fourth differential signals $L_4$ and $\overline{L_4}$ (corresponding to the first band) and a second interference signal $N_2$ (corresponding to the second band). The signals ($L_4$ and $\overline{L_4}$) and the noise signal ($N_2$) have been separated into different bands. Therefore, using the following circuits, the noise signal ($N_2$) can be filtered out through use of an appropriate filter.

As described above, the desired fourth differential signals $L_4$ and $\overline{L_4}$ and the noise signal (the second interference signal $N_2$) generated by the amplifier 300 are separated into different bands. For example, the frequency corresponding to the first band is lower than the frequency corresponding to the second band. Hence, the differential signals $L_1$ and $\overline{L_1}$ received by the amplifier 300 are low frequency signals, while the fourth differential signals $L_4$ and $\overline{L_4}$ are also low frequency signals. However, the first interference signal $N_1$, originally being a low frequency signal, is subsequently modulated to generate the second interference signal $N_2$ of a higher band. Therefore, the undesired second interference signal $N_2$ can be filtered out through a filter coupled to the second modulator 340. The first modulator 320 and the second modulator 340 of the amplifier 300 perform the function of separating noise signals from the desired signals. Therefore, the following circuits can utilize an appropriate filter to filter out signals not located in the desired first band to complete the operation of attenuating noise signals.

Figure 4:
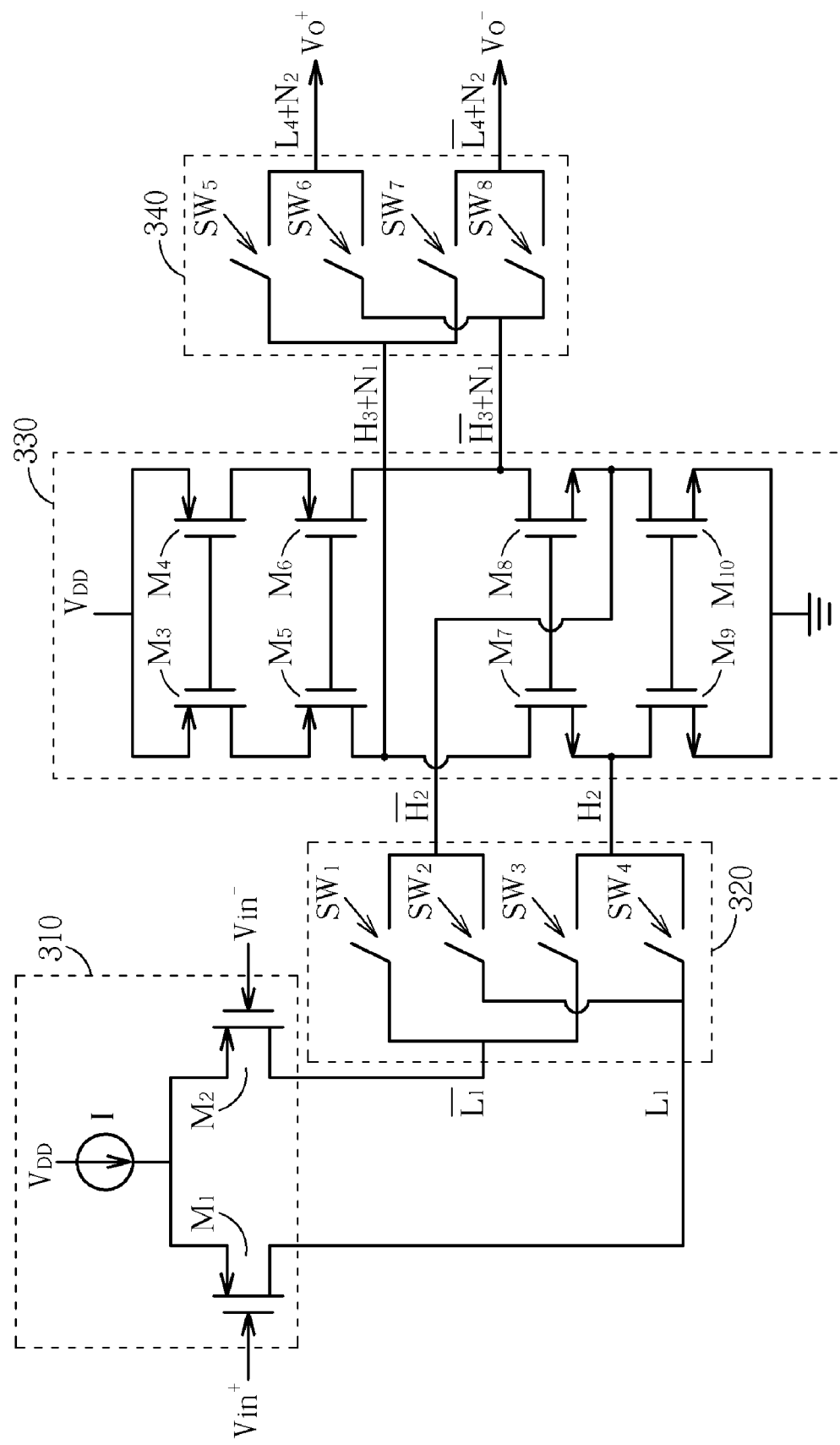
FIG. 4 is detailed circuit diagram describing the operational amplifier 300 shown in FIG. 3.

FIG. 4 is a detailed circuit diagram describing the folded-cascode operational amplifier 300 shown in FIG. 3. This present embodiment adopts two modulators in a folded-cascode OP. Please note that any amplifiers applying the structure shown in FIG. 3 are covered in the scope of the present invention. In the present embodiment, the input stage 310 comprises a predetermined current sources/and two MOS transistors $M_1$ and $M_2$. The gate terminal of the input stage 310 is connected to the differential input ends Vin+ and Vin– of the operational amplifier 300. The input stage amplifies the input signals Vin+ and Vin– and outputs the first differential signals $L_1$ and $\overline{L_1}$ from the drain terminal to the first modulator 320. In a preferred embodiment, the transistors $M_1$ and $M_2$ are PMOS transistors. To those skilled in the art, a PMOS transistor has a reduced flicker noise when compared to an NMOS transistor. Therefore, the flicker noise produced by the input stage 310 to the first differential signals $L_1$ and $\overline{L_1}$ are very minor and does not seriously interferes with the first differential signals $L_1$ and $\overline{L_1}$. The first modulator 320 comprises of a plurality of switch components: $SW_1$, $SW_2$, $SW_3$ and $SW_4$. If the switch components $SW_1$ and $SW_4$ are turned-on, the switch components $SW_2$ and $SW_3$ will be turned-off. Moreover, if the switch components $SW_2$ and $SW_3$ are on, the switch components $SW_1$ and $SW_4$ will be off. In summary, the first modulator 320 alternatively turns on switch components $SW_1$ $SW_4$ or switches $SW_2$, $SW_3$ during the operation of the amplifier 300.

In the present embodiment, the middle stage 330 is one stage in amplifier 300; that means the middle stage 330 is utilized as an amplifier stage, a load stage or an output stage of the operational amplifier 300. However, the middle stage 330 can be implemented by multiple stages of circuits. For example, the middle stage 330 can comprise an amplifier stage followed by an output stage. This type of configuration can be achieved through different variations, with all associated variations producing the similar result covered in the scope of the present invention. As shown in FIG. 4, the middle stage 330 according to the preferred embodiment comprises a plurality of cascode MOS transistors: $M_3$, $M_4$, $M_5$, $M_6$, $M_7$, $M_8$, $M_9$ and $M_{10}$. The MOS transistors $M_7$, $M_8$, $M_9$ and $M_{10}$ are NMOS transistors. Compared to a PMOS transistor, the flicker noise generated by a NMOS transistor is fairly significant and cannot be ignored. Hence, when the middle stage 330 processes the second differential signals $H_2$ and $\overline{H_2}$ to generate the third differential signals $H_3$ and $\overline{H_3}$, the MOS transistors $M_7$, $M_8$, $M_9$ and $M_{10}$ act to conduct the flicker noise (the first interference signal $N_1$) corresponding to the first band to the output signal (the third differential signals $H_3$ and $\overline{H_3}$) of the middle stage 330.

The second modulator 340 comprises a plurality of switch components $SW_5$, $SW_6$, $SW_7$ and $SW_8$. If the switch components $SW_5$ and $SW_8$ are turned-on, then the switch components $SW_6$ and $SW_7$ will be turned-off. Likewise, if the switch components $SW_6$ and $SW_7$ are turned-on, the switch components $SW_5$ and $SW_8$ will be turned-off. The first and the second modulators 320 and 340 are controlled by a same clock to control the differential output ends Vo+ and Vo– to appropriately correspond to the respective differential input ends Vin+ and Vin–. On the other hands, the first and the second modulators 320 and 340 also can be controlled by different phase clock to perform the modulation. For example, the switches $SW_1$ $SW_4$, $SW_5$, $SW_8$ are controlled by a clock with 0 degree phase and the $SW_2$, $SW_3$, $SW_6$, $SW_7$ are controlled by a clock with 180 degree phase. As mentioned, in the second modulator 340, the switch components $SW_5$, $SW_8$ and the switch components $SW_6$, $SW_7$ alternate being on. Therefore, the input signal originally corresponding to the first band is modulated to generate the output signal corresponding to the second band, while the input signal originally corresponding to the second band is modulated to generate the output signal corresponding to the first band. Hence, the second modulator 340 modulates the third differential signals $H_3$ and $\overline{H_3}$ to generate the fourth differential signals $L_4$ and $\overline{L_4}$ corresponding to the first band, and further modulates the first interference signal $N_1$ corresponding to the first band to generate the second interference signal $N_2$ corresponding to the second band. In this way, the operational amplifier 300 completes the process of modulating the flicker noise from a low band (mainly produced by the MOS transistors $M_7$, $M_8$, $M_9$ and $M_{10}$) to a high band such that the flicker noise and the differential signals $L_4$ and $\overline{L_4}$ in the low band are separated. Therefore, the chopping function is performed by two modulators, and the chopping function also provides the effect of a "frequency separation" to the undesired noise signal to be separated from in the circuit.

The amplifier according to the present invention adds a modulator into the drain terminal of the input differential pairs of the input stage. In this way, if the amplifier of the present invention is utilized in a switch-capacitor circuit (i.e., the integrated circuit in a Sigma-delta modulator or Sigma-delta ADC), the possibility of interference with the integrated capacitor that stores information can be avoided. In addition, the operation of the two modulators only requires two signal lines: a chopping clock and an inverse signal of the chopping clock.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An amplifier comprising:
   an input stage, for receiving an input signal to generate a first signal corresponding to a first band;

a first modulator, coupled to the input stage, for modulating the first signal corresponding to the first band to generate a second signal corresponding to a second band, wherein the first modulator is controlled by clock signals with different phase; and a load stage, coupled to the first modulator, for outputting a third signal corresponding to the first band and the second band according to the second signal;

wherein the first signal and the second signal are differential signals.

2. The amplifier of claim 1, wherein the amplifier circuit further comprises:

a second modulator, coupled to the load stage, for modulating the third signal to generate a fourth signal corresponding to the first band and the second band.

3. The amplifier of claim 2, wherein the fourth signal comprises a second outputted signal corresponding to the first band and a second interference signal corresponding to the second band.

4. The amplifier of claim 1, wherein the input stage comprises a first transistor and a second transistor, wherein gate terminals of the first and the second transistors are utilized for receiving the input signal, and the drain terminals of the first and the second transistors generate the first signal to the first modulator, wherein the input signal is a differential input signal.

5. The amplifier of claim 4, wherein each of the first and the second transistors are PMOS transistors.

6. The amplifier of claim 1, wherein the third signal comprises a first outputted signal corresponding to the second band and a first interference signal corresponding to the first band.

7. The amplifier of claim 1, wherein the load stage comprises a plurality of cascode transistors.

8. The amplifier of claim 1, wherein the first modulator is a frequency modulator comprising a plurality of switches.

9. The amplifier of claim 1, wherein a frequency of the first band is lower than a frequency of the second band.

10. The amplifier of claim 1, being applied to a circuit of Sigma-delta analog-to-digital converter.

11. A noise separation method applied to an amplifier, comprising:

amplifying an input signal to generate a first signal corresponding to a first band;

modulating the first signal to generate a second signal corresponding to a second band;

processing the second signal to generate a third signal corresponding to the first band and the second band; and modulating the third signal to generate a fourth signal corresponding to the first band and the second band;

wherein the step of modulating the first signal and the step of modulating the third signal are controlled by clock signals.

12. The method of claim 11, further comprising:

filtering the forth signal to generate an output signal corresponding to the first band.

13. The method of claim 12, wherein the input signal is a differential input signal.

14. An amplifier, comprising:

an input stage for receiving an input signal to generate a first signal, the input stage comprising:

a first current source for generating a first current; and a differential pair, coupled to the first current source, for receiving the input signal and the first current, and generating the first signal;

a first modulator, coupled to the input stage, for modulating the first signal to generate a second signal, wherein the first signal and the second signal belong to different bands; and the first modulator is controlled by clock signals with different phases; and a load stage coupled to the first modulator, for processing the second signal to generate a third signal;

wherein the first signal and the second signal are differential signals.

15. The amplifier of claim 14, further comprising:

a second modulator coupled to the load stage, for modulating the third signal to generate a fourth signal, wherein the third signal and the fourth signal belong to different bands.

16. The amplifier of claim 14, wherein the load stage comprises a plurality of cascode transistors.

17. The amplifier of claim 14, wherein the first modulator is a frequency modulator comprising a plurality of switches.

* * * * *